United States Patent
Harigai et al.

(10) Patent No.: US 8,093,784 B2
(45) Date of Patent: Jan. 10, 2012

(54) PIEZOELECTRIC POWER GENERATING ELEMENT, AND METHOD OF GENERATING ELECTRIC POWER USING THE PIEZOELECTRIC POWER GENERATING ELEMENT

(75) Inventors: Takakiyo Harigai, Kyoto (JP); Michihito Ueda, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/191,139

(22) Filed: Jul. 26, 2011

(65) Prior Publication Data

US 2011/0278991 A1    Nov. 17, 2011

Related U.S. Application Data

(63) Continuation of application No. PCT/JP2011/000023, filed on Jan. 6, 2011.

(30) Foreign Application Priority Data

Jan. 7, 2010    (JP) .................................. 2010-001670

(51) Int. Cl.
  *H02N 2/00* (2006.01)
  *H01L 41/107* (2006.01)

(52) U.S. Cl. ........ 310/339; 310/367; 310/330; 310/331; 310/324

(58) Field of Classification Search ............ 310/324, 310/330–332, 339, 367
  See application file for complete search history.

(56) References Cited

U.S. PATENT DOCUMENTS

| | | | |
|---|---|---|---|
| 5,751,091 A | 5/1998 | Takahashi et al. | |
| 6,107,726 A * | 8/2000 | Near et al. | 310/328 |
| 7,057,330 B2 * | 6/2006 | Buhler et al. | 310/339 |
| 7,948,153 B1 * | 5/2011 | Kellogg et al. | 310/339 |

(Continued)

FOREIGN PATENT DOCUMENTS

JP    9-205781    8/1997

(Continued)

*Primary Examiner* — Jaydi San Martin
(74) *Attorney, Agent, or Firm* — McDermott Will & Emery LLP

(57) ABSTRACT

Provided is a relatively easy-to-fabricate piezoelectric power generating element capable of generating a large amount of electric power while comprising a bridge-type vibration beam that is resistant to damage from external vibration. This element comprises a support member, a strip-shaped vibration beam, a piezoelectric layer, and electrodes. The first and second ends of the vibration beam are fixed to the support member. The piezoelectric layer and the electrodes are provided on the surface of the vibration beam. The vibration beam extends in a plane when it is not vibrating. The vibration beam has a first portion that extends from the first end fixed to the support member, a second portion that extends from the second end fixed to the support member, and a third portion that connects the end of the first portion opposite to the first end and the end of the second portion opposite to the second end. The vibration beam has a shape such that, when viewed in a direction perpendicular to the plane, a first direction in which the first portion extends is a direction closer to the second end, and a second direction in which the second portion extends is a direction closer to the first end, the first and second directions each make an angle of more than 0° and less than 90° with respect to a straight line connecting the center of the first end and the center of the second end, and the third portion intersects once the straight line.

8 Claims, 13 Drawing Sheets

U.S. PATENT DOCUMENTS

| | | | |
|---|---|---|---|
| 7,986,076 B2 * | 7/2011 | Yoon et al. | 310/329 |
| 8,022,600 B2 * | 9/2011 | Hirasawa et al. | 310/339 |
| 2010/0013357 A1 | 1/2010 | Hirasawa et al. | |
| 2011/0140577 A1 * | 6/2011 | Galchev et al. | 310/339 |

FOREIGN PATENT DOCUMENTS

| | | |
|---|---|---|
| JP | 2001-112274 | 4/2001 |
| JP | 2001112274 A * | 4/2001 |
| JP | 2002-218771 | 8/2002 |
| JP | 2002218771 A * | 8/2002 |
| JP | 3790255 B1 | 6/2006 |
| JP | 2006-246688 | 9/2006 |
| JP | 2007-026804 | 2/2007 |
| JP | 2007026804 A * | 2/2007 |
| JP | 3939737 | 7/2007 |
| JP | 2010-216842 | 9/2010 |
| JP | 2011-069758 | 4/2011 |
| WO | WO 2008/053835 A1 | 5/2008 |

* cited by examiner

PIEZOELECTRIC POWER GENERATING ELEMENT, AND METHOD OF GENERATING ELECTRIC POWER USING THE PIEZOELECTRIC POWER GENERATING ELEMENT

CROSS-REFERENCE TO RELATED APPLICATIONS

This is a continuation of PCT International Application PCT/JP2011/000023 filed on Jan. 6, 2011, which claims priority of Japanese Patent Application No. 2010-001670, filed on Jan. 7, 2010. The disclosures of these applications including the specifications, the drawings, and the claims are hereby incorporated by reference in their entirety.

BACKGROUND OF THE INVENTION

1. Field of the Invention

The present invention relates to a piezoelectric power generating element, and a method of generating electric power using the same.

2. Description of Related Art

Vibration power generation is an electric power generation method in which mechanical energy inherent in mechanical vibration is converted into electrical energy. Vibration power generation utilizes electromagnetic induction, electrostatic induction, or the piezoelectric effect, for example. Among these, vibration power generation utilizing the piezoelectric effect (piezoelectric power generation) exhibits high power density. This is because an element for piezoelectric power generation (a piezoelectric power generating element) has a simple structure and therefore can be reduced in size. A piezoelectric power generating element (a vibration power generating element) is an element that converts energy of mechanical vibration applied to a piezoelectric layer into electrical energy by the piezoelectric effect so as to generate electric power.

FIG. 11 and FIG. 12 show conventional piezoelectric power generating elements.

The element shown in FIG. 11 comprises a fixed-free type (cantilever-type) vibration beam 102. The vibration beam 102 has a strip shape. One end (fixed end) 103 of the vibration beam 102 is fixed to a frame 104. The other end 105 of the vibration beam 102 is not fixed to the frame 104. The end 105 is a free end. The end 105 can vibrate in a direction perpendicular to the main surface of the vibration beam 102. A power generation layer 101 is provided on one of the surfaces of the vibration beam 102. The power generation layer 101 comprises a piezoelectric layer and a pair of electrodes that sandwich the piezoelectric layer therebetween. When external vibration is applied to the element shown in FIG. 11, the vibration beam 102 vibrates in response to the vibration applied. This vibration deforms the piezoelectric layer included in the power generation layer 101. This deformation generates, based on the piezoelectric effect, a potential difference between the pair of electrodes that sandwich the piezoelectric layer therebetween. The power generation layers 101 may be provided on both of the surfaces of the vibration beam 102. Apart of the power generation layer 101 may also be provided on the surface of the frame 104. The element shown in FIG. 11 is disclosed in JP 09 (1997)-205781 A, for example.

The element shown in FIG. 12 comprises a fixed-fixed type (bridge-type) vibration beam 201. The vibration beam 201 has a strip shape. Both ends 202 and 203 of the vibration beam 201 are fixed to the frame 104. A power generation layer 101 is provided on one of the surfaces of the vibration beam 201. When external vibration is applied to the element shown in FIG. 12, the vibration beam 201 vibrates in response to the vibration applied. The amplitude of the vibration is maximum at the center portion 204 of the vibration beam 201. This vibration deforms a piezoelectric layer included in the power generation layer 101. This deformation generates, based on the piezoelectric effect, a potential difference between the pair of electrodes that sandwich the piezoelectric layer therebetween. The element shown in FIG. 12 is disclosed in JP 3790255 B1, for example.

In the element shown in FIG. 11, the vibration beam 102 is a cantilever-type beam. Therefore, the vibration of the vibration beam 102 is less restricted. The less restriction of the vibration allows a relatively large amount of electric power to be generated. On the other hand, the vibration beam 102 is susceptible to damage from excessive external vibration.

In contrast, in the element shown in FIG. 12, the vibration beam 201 is a bridge-type beam. The bridge-type vibration beam 201 is resistant to damage from external vibration. On the other hand, since both of the ends of the vibration beam are fixed, the vibration amplitude of the beam is smaller, and the amount of electric power generated tends to be small accordingly. JP 3939737 B1 discloses a technique for increasing the vibration amplitude of the bridge-type vibration beam. Specifically, in the element disclosed in JP 3939737 B1, the vibration beam is previously bent and held in a bistable state. In this element, the vibration beam vibrates between two stable states alternately. The amplitude of this vibration is larger than the amplitude that can be presented by the vibration beam 201 shown in FIG. 12.

In addition to JP 09 (1997)-205781 A, JP 3790255 B1, and JP 3939737 B1 above, JP 2006-246688 A and JP 2007-026804 A may be related to the present invention. JP 2007-026804 A does not disclose a piezoelectric power generating element. JP 2007-026804 A discloses a high-frequency micromachined switch. The piezoelectric power generating element is based on the technology relating to the vibration of a beam. The high-frequency micromachined switch is based on the technology for holding a beam as a switch in the OFF or ON position, that is, for switching the beam between specified two modes to hold it in one of the modes. No consideration is given to the vibration of the beam in the high-frequency micromachined switch. The technology on which the piezoelectric power generating element is based is completely different from the technology on which the high-frequency micromachined switch is based.

SUMMARY OF THE INVENTION

The approach of previously bending the vibration beam increases the amplitude of the vibration beam. For this purpose, however, it is essential, during the fabrication of a piezoelectric power generating element, to bend the vibration beam, search for the bistable positions, adjust the bending of the vibration beam, and keep the vibration beam fixed in the adjusted position. This complicates the fabrication process of the piezoelectric power generating element. A relatively easy-to-fabricate piezoelectric power generating element comprising a bridge-type vibration beam and capable of generating a large amount of electric power has not been obtained so far.

It is an object of the present invention to provide a relatively easy-to-fabricate piezoelectric power generating element capable of generating a large amount of electric power while comprising a bridge-type vibration beam that is resistant to damage from external vibration. It is another object of the present invention to provide a method of generating electric power using the piezoelectric power generating element.

The piezoelectric power generating element of the present invention comprises a support member, a strip-shaped vibration beam, a piezoelectric layer, and a pair of electrodes that sandwich the piezoelectric layer therebetween. Both of the ends (a first end and a second end) of the vibration beam are fixed to the support member. The piezoelectric layer and the pair of electrodes are provided on a surface of the vibration beam. The vibration beam extends in a plane when the vibration beam is not vibrating. The vibration beam has a first portion that extends from the first end fixed to the support member, a second portion that extends from the second end fixed to the support member, and a third portion that connects an end of the first portion opposite to the first end and an end of the second portion opposite to the second end. The vibration beam has a shape of (1) to (3) below, when viewed in a direction perpendicular to the plane. (1) A first direction in which the first portion extends from the first end is a direction closer to the second end, and a second direction in which the second portion extends from the second end is a direction closer to the first end, (2) the first and second directions each make an angle of more than 0° and less than 90° with respect to a straight line connecting a center of the first end with a center of the second end, and (3) the third portion intersects once the straight line.

The method of the present invention is a method of generating electric power using a piezoelectric power generating element, and this method comprises a step (a) of preparing the above-mentioned piezoelectric power generating element and a step (b) of applying vibration to the piezoelectric power generating element so as to generate a potential difference between the pair of electrodes.

The power generating element of the present invention comprises a vibration beam having a specific shape. This makes it possible to obtain a relatively easy-to-fabricate piezoelectric power generating element resistant to damage from external vibration and capable of generating a large amount of electric power. The piezoelectric power generating element of the present invention can harvest a large amount of electric power from vibrations existing in the surrounding environment of the element. The use of the piezoelectric power generating element of the present invention makes it possible to obtain a small and robust self-contained power generator with high productivity.

DETAILED DESCRIPTION OF THE INVENTION

Figure 1:
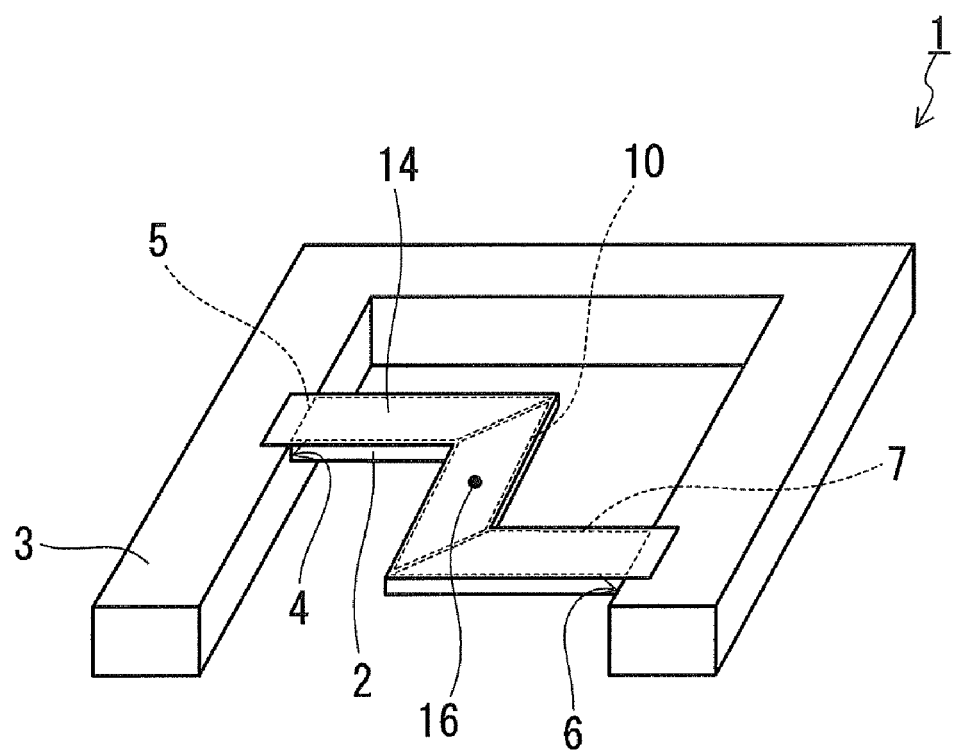
FIG. 1 is a perspective view schematically showing an example of a piezoelectric power generating element of the present invention.

Hereinafter, embodiments of the present invention will be described. In the following description, the same components are designated by the same reference numerals, and hence repetitive description is omitted.

[Piezoelectric Power Generating Element]

FIG. 1 shows an example of a piezoelectric power generating element of the present invention. A piezoelectric power generating element 1 shown in FIG. 1 comprises a strip-shaped vibration beam 2. Both of the ends (a first end 4 and a second end 6) of the vibration beam 2 are fixed to a support member (base member) 3. The portion (vibration portion) other than these ends (fixed ends) of the vibration beam 2 can vibrate in response to external vibration. That is, the vibration beam 2 is a bridge-type beam. Therefore, the vibration beam 2 is resistant to damage from external vibration. The vibration beam 2 is fixed to the support member 3 in such a manner that the vibration portion can vibrate in the thickness direction of the beam.

The vibration beam 2 extends in a plane when it is not vibrating. This means that it is not necessary, during the fabrication of the element 1, to bend the vibration beam, search for the bistable positions, adjust the bending of the vibration beam, and keep the vibration beam fixed in the adjusted position. Therefore, it is relatively easy to fabricate the element 1. The direction perpendicular to the plane in which the vibration beam 2 extends is the same as the direction perpendicular to the main surface of the vibration beam 2.

The vibration beam 2 has a first portion 5 that extends from the first end 4 fixed to the support member 3, a second portion 7 that extends from the second end 6 fixed to the support member 3, and a third portion 10 that connects the end of the first portion 5 opposite to the first end 4 and the end of the second portion 7 opposite to the second end 6.

Figure 2:
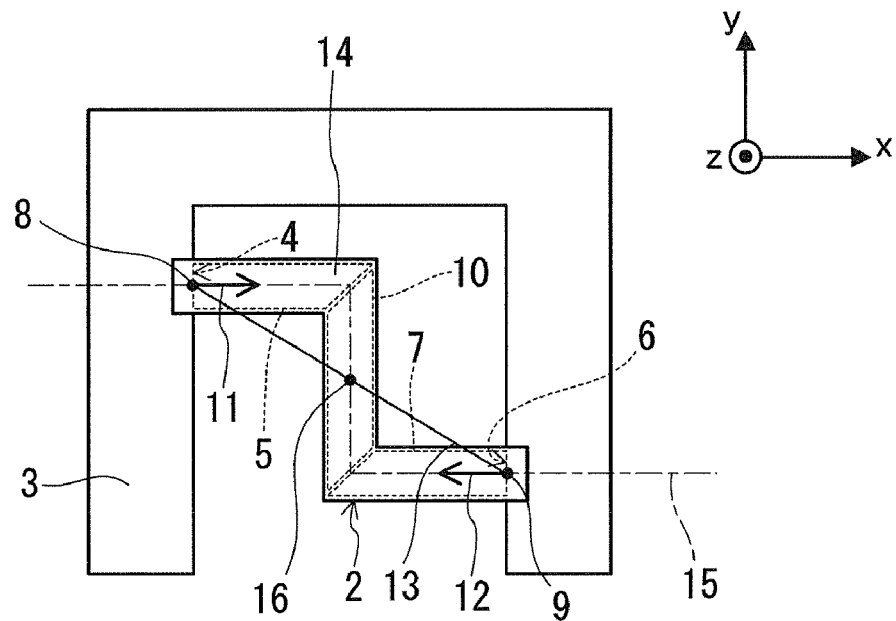
FIG. 2 is a schematic plan view of the piezoelectric power generating element shown in FIG. 1, as viewed in a direction perpendicular to a plane in which a vibration beam comprised in the element extends.

FIG. 2 is a plan view of the element 1 shown in FIG. 1, as viewed in the direction perpendicular to the plane in which the vibration beam 2 extends. As shown in FIG. 2, when viewed in the direction perpendicular to the plane in which the vibration beam 2 extends, the first direction 11 in which the first portion 5 extends from the first end 4 of the vibration beam 2 is a direction closer to the second end 6 of the vibration beam 2. The second direction 12 in which the second portion 7 extends from the second end 6 of the vibration beam 2 is a direction closer to the first end 4 of the vibration beam 2. The first direction 11 and the second direction 12 each intersect a straight line 13 connecting the center 8 of the first end 4 of the vibration beam 2 and the center 9 of the second end 6 thereof at an angle of more than 0° and less than 90°. The third portion 10 intersects once the straight line 13.

A power generation layer 14 comprising a piezoelectric layer and a pair of electrodes that sandwich the piezoelectric layer therebetween is provided on the surface of the vibration beam 2. The thickness direction of the strip-shaped vibration beam 2 is the same as the thickness direction of the piezoelectric layer.

The element 1 comprising the vibration beam 2 generates a large amount of electric power when external vibration is applied.

Figure 12:
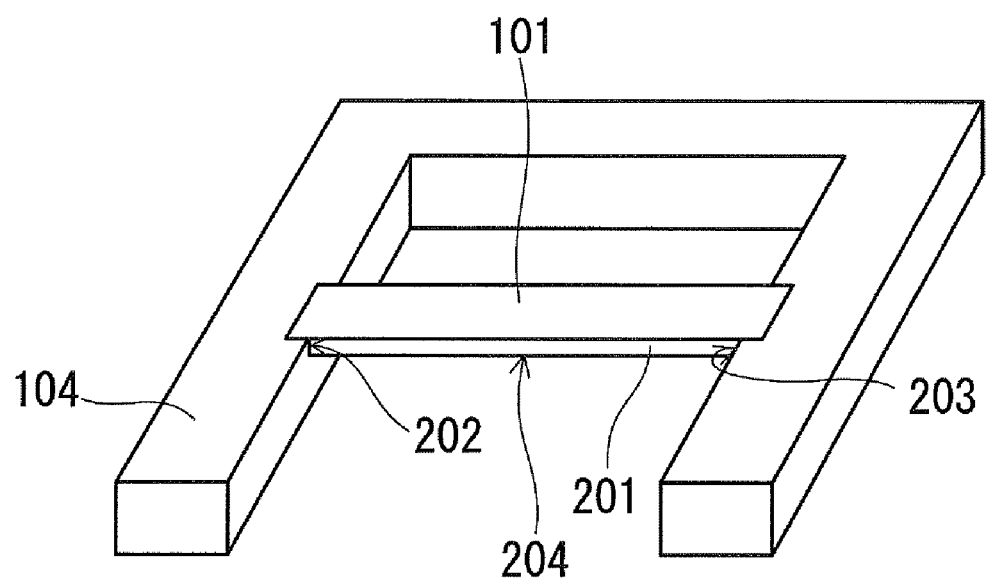
FIG. 12 is a perspective view schematically showing an example of a conventional piezoelectric power generating element comprising a bridge-type vibration beam.

The conventional piezoelectric power generating element shown in FIG. 12 comprises a bridge-type vibration beam 201. In the vibration beam 201, however, the direction in which the beam 201 extends from one end 202 thereof coincides with the direction in which the beam 201 extends from the other end 203 thereof. In addition to this, these directions are parallel to a straight line connecting the centers of both of the ends of the beam 201. This means that the angle formed between these directions and the straight line is 0°. This straight bridge-shaped vibration beam 201 is rigid. The vibration beam 201 can vibrate at only a small amplitude. In contrast, the vibration beam 2 is more flexible on the basis of its shape such that the first direction 11 and the second direction 12 intersect the straight line 13 at an angle greater than 0°. Therefore, the vibration beam 2 can vibrate at a larger amplitude.

However, a vibration beam cannot generate a larger amount of electric power just because it can vibrate at a larger amplitude. This is because, in a piezoelectric power generating element, electric power is generated by vibration in the direction perpendicular to the plane in which the vibration beam extends (i.e., the thickness direction of the vibration beam and the piezoelectric layer, for example, the z direction shown in FIG. 2). In view of this, the vibration beam 2 has the above-described shape.

When external mechanical vibration is applied to the element 1 in the direction perpendicular to the plane in which the vibration beam 2 extends (the z direction shown in FIG. 2), the vibration beam 2 vibrates in the z direction so as to generate electric power. Vibrations in other directions including, for example, a y-direction vibration shown in FIG. 2, do not contribute to electric power generation. However, external vibration rarely consists of a z-direction component. External vibration usually includes components other than a z-direction component. When external vibration including a y-direction component is applied to the element 1, the y-direction vibration of the vibration beam 2 is damped. The damped y-direction vibration is concentrated into the z-direction vibration, and contributes to electric power generation. Thus, the element 1 generates a larger amount of electric power.

Figure 3:
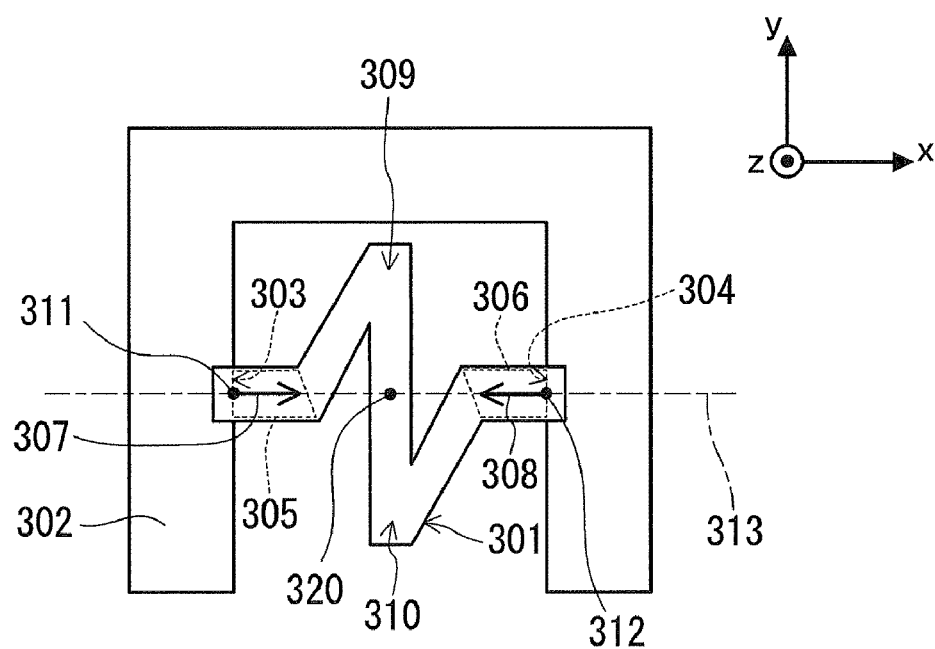
FIG. 3 is a plan view schematically showing an example of a piezoelectric power generating element comprising a vibration beam with a bent portion but not included in the present invention.

A bent portion or a curved portion allows the vibration beam to vibrate at a large amplitude. However, the y-direction vibration of the vibration beam is damped to a lesser degree unless the shape of the vibration beam conforms to the above-described shape. This means that a smaller amount of y-direction vibration is concentrated into z-direction vibration, resulting in a decrease in the amount of electric power generated. FIG. 3 shows an example of a vibration beam having a shape that does not conform to the above-described shape, although having a bent portion or a curved portion.

A vibration beam 301 shown in FIG. 3 extends in a plane when it is not vibrating. FIG. 3 is a plan view as viewed in the direction perpendicular to the plane in which the vibration beam 301 extends. The vibration beam 301 has a portion 305 that extends from one end 303 thereof fixed to a support member 302 and a portion 306 that extends from the other end 304 thereof fixed to the support member 302. The vibration beam 301 has a bent portion 309 and a bent portion 310 between the portion 305 and the portion 306. The bent portions 309 and 310 contribute to an increase in the amplitude at which the vibration beam 301 can vibrate. However, when viewed in the direction perpendicular to the plane in which the vibration beam 301 extends, a direction 307 in which the portion 305 extends from the end 303 and a direction 308 in which the portion 306 extends from the end 304 are parallel to a straight line 313 connecting the center 311 of the end 303 and the center 312 of the end 304. That is, the angle formed between these directions 307 and 308 and the straight line 313 is 0°. When vibration including a y-direction component is applied to the vibration beam 301, the vibration beam 301 vibrates in the y direction. This means that, in the vibration beam 301, a smaller amount of y-direction vibration is concentrated into z-direction vibration, resulting in a decrease in the amount of electric power generated.

In the vibration beam 2 shown in FIG. 1 and FIG. 2, the first direction 11 in which the first portion 5 extends is a direction closer to the second end 6 at which the second portion 7 is fixed to the support member 3. The second direction 12 in which the second portion 7 extends is a direction closer to the first end 4 at which the first portion 5 is fixed to the support member 3. If the direction 11 is a direction away from the second end 6 and the direction 12 is a direction away from the first end 4, the third portion 10 connecting the first portion 5 and the second portion 7 is long in length and complicated in shape.

Furthermore, the first direction 11 and the second direction 12 each intersect the straight line 13 connecting the center 8 of the first end 4 and the center 9 of the second end 6 at an angle of less than 90°. If the direction 11 and the direction 12 each intersect the straight line 13 at an angle of 90° or more, the third portion 10 is long in length and complicated in shape.

Furthermore, the third portion 10 intersects once the straight line 13. If the third portion 10 intersects twice or more, the third portion 10 is long in length and complicated in shape.

The shape of the vibration beam 2 is based on the technical concept that the length of the third portion 10 connecting the first portion 5 and the second portion 7 is reduced to avoid an excessively complicated shape while increasing the amplitude of vibration. A vibration beam having a long third portion or a complicated-shaped third portion tends to vibrate in the directions other than the z direction. As a result, an amount of electric power generation decreases.

The amplitude of vibration of the vibration beam is maximum in the vicinity of the fixed ends of the vibration beam (the ends fixed to the support member). The larger the amplitude is, the more electric power is generated. This means that among the first, second, and third portions, the third portion makes a relatively small contribution to the amount of electric power generated. Therefore, even if the length of the third portion is reduced, the effect of concentrating vibration into the z direction increases an amount of electric power generation.

The plane is divided into two regions by the straight line connecting the centers of both ends of the vibration beam. When the third portion never intersects the straight line, the vibration beam is present in only one of the two regions. The vibration beam having such a shape tends to vibrate in the directions other than the z direction, regardless of the length of the vibration beam. As a result, an amount of electric power generation decreases. In the piezoelectric power generating element of the present invention, the third portion intersects once the straight line. In this case, the vibration beam is present in both of the two regions.

The vibration portion of the vibration beam 2 shown in FIG. 1 and FIG. 2 has a uniform width, when viewed in the direction perpendicular to the plane in which the vibration beam 2 extends. The first portion 5 and the second portion 7 are trapezoidal in shape when viewed in the direction perpendicular to the plane. The third portion 10 is parallelogram in shape when viewed in the direction perpendicular to the plane. The vibration beam 2 has two right-angled bent portions. One of the bent portions is located at the junction between the first portion 5 and the third portion 10. The other bent portion is located at the junction between the second portion 7 and the third portion 10. The vibration beam 2 shown in FIG. 1 and FIG. 2 has a crank shape when viewed in the direction perpendicular to the plane.

Figure 4A:
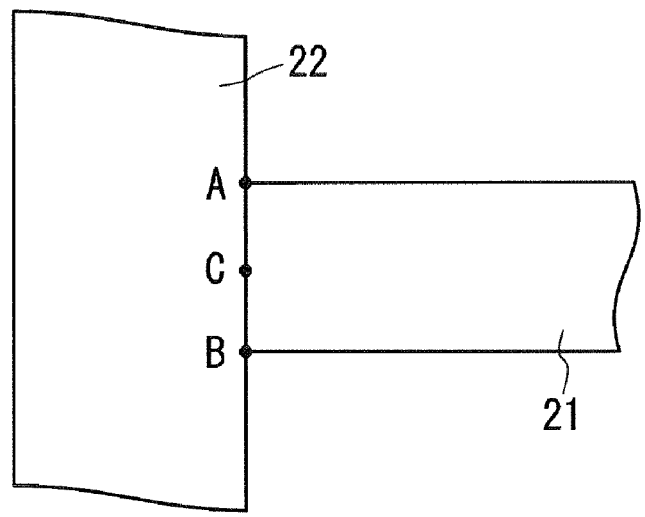
FIG. 4A is a schematic view for explaining the center of the end of a vibration beam.
Figure 4B:
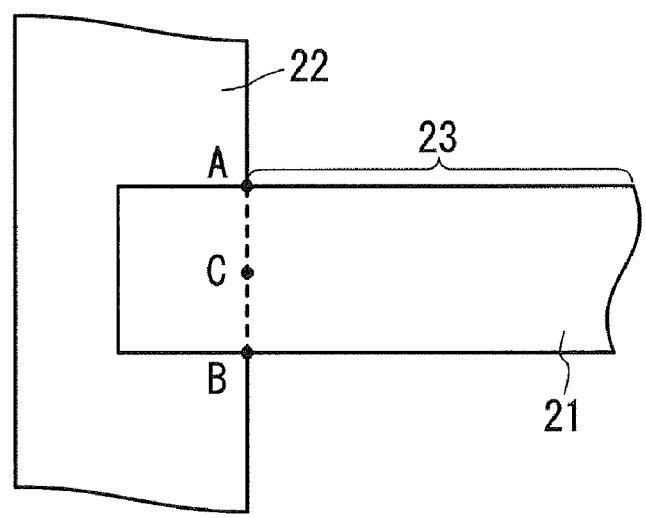
FIG. 4B is a schematic view for explaining the center of the end of a vibration beam.

The center of the end of the vibration beam is the following point. In the case where the side surface of a vibration beam 21 is fixed to a support member 22 (see FIG. 4A) like the vibration beam 2 shown in FIG. 1 and FIG. 2, the center is a midpoint C of a line segment AB connecting the endpoints A and B on the side surface of the vibration beam 21 that is in contact with the support member 22, when viewed in the direction perpendicular to the plane in which the vibration beam 21 extends. In the case where the reverse surface (main surface) of the vibration beam 21 is fixed to the support member 22 (see FIG. 4B), the center is a midpoint C of a line segment AB connecting the endpoints A and B on the edge as the end of a portion (a vibration portion) 23 of the vibration beam 21 that does not overlap with the support member 22, when viewed in the direction perpendicular to the plane in which the vibration beam 21 extends.

The direction in which the first portion extends and the direction in which the second portion extends mean a direction in which the center line of the first portion extends and a direction in which the center line of the second portion extends, respectively. The center line extends in the longitudinal direction of the strip-shaped vibration beam. The center lines of the first portion and the second portion are straight lines.

The intersection between the third portion and the straight line means the intersection between the center line of the third portion and the straight line.

In the piezoelectric power generating element of the present invention, the shapes of the first portion and the second portion are not limited as long as they satisfy the following conditions. Both of the ends (the first end and the second end) are fixed to the support member. The first portion extends from the first end and the second portion extends from the second end. The first portion and the second portion extend in a plane when they are not vibrating. When viewed in the direction perpendicular to the plane in which the vibration beam extends, the direction (the first direction) in which the first portion extends from the first end is a direction closer to the second end, and the direction (the second direction) in which the second portion extends from the second end is a direction closer to the first end. When viewed in the direction perpendicular to the plane in which the vibration beam extends, the first and second directions each make an angle of more than 0° and less than 90° with respect to a straight line connecting the centers of these ends.

The shape of the third portion is not limited as long as it connects the other end of the first portion and the other end of the second portion, extends in the same plane in which the first portion and the second portion extend, and intersects once the above-mentioned straight line. The third portion may have a curved portion and/or a bent portion, when viewed in the direction perpendicular to the plane in which the vibration beam extends.

Preferably, in the vibration beam, the first direction and the second direction are parallel to each other. In this case, a larger amount of vibrations in the directions other than the z direction is concentrated into the z-direction vibration.

Preferably, the vibration beam has a point-symmetric shape, when viewed in the direction perpendicular to the plane in which the vibration beam extends. In this case, a larger amount of vibrations in the directions other than the z direction is concentrated into the z-direction vibration. The vibration beam 2 shown in FIG. 1 and FIG. 2 is symmetrical about a point 16 on the center line 15 of the beam. The point 16 is located at the midpoint of the center line 15 between the first end 4 and the second end 6.

In the piezoelectric power generating element of the present invention, a weight may be placed on the surface of the vibration beam. The use of the weight allows the response frequency of the piezoelectric power generating element and the level of detected vibration to be controlled.

As shown in FIG. 1 and FIG. 2, in the piezoelectric power generating element of the present invention, the power generation layer 14 is provided on the surface of the vibration beam 2. The power generation layer 14 comprises a piezoelectric layer and a pair of electrodes that sandwich the piezoelectric layer therebetween. The power generation layer 14 is provided on at least a part of the surface of the vibration beam 2. Apart of the surface of the vibration beam 2 may not be covered with the power generation layer 14. The power generation layer 14 may be provided on both of the surfaces (main surfaces) of the vibration beam 2. The power generation layer 14 may further be provided on a portion at which the vibration beam 2 is fixed to the support member 3 and on the surface of the support member 3. In FIG. 1 and FIG. 2, the thickness of the power generation layer 14 is not shown, but in fact, the power generation layer 14 has a thickness.

The material that makes up the piezoelectric layer has piezoelectric properties. Specific examples of such materials include: ferroelectrics containing lead such as $Pb(Zr,Ti)O_3$; ferroelectrics such as $BaTiO_3$, $(Bi,Na)TiO_3$, and $(K,Na)$ NbO₃; and polymeric piezoelectric materials. The material that makes up the piezoelectric layer may be a known piezoelectric material.

The electrodes are made of a conductive material. There is no limitation on the material.

A person skilled in the art could adjust the thicknesses of the vibration beam, the piezoelectric layer, and the electrodes, the configuration of the power generation layer, and the shape of the support member appropriately. In the element 1 shown in FIG. 1 and FIG. 2, the support member 3 has a U shape surrounding the vibration beam 2, when viewed in the direction perpendicular to the plane in which the vibration beam 2 extends.

A person skilled in the art could fabricate the piezoelectric power generating element of the present invention by using a known method.

Possible variations of the piezoelectric power generating element of the present invention are described below.

Figure 5A:
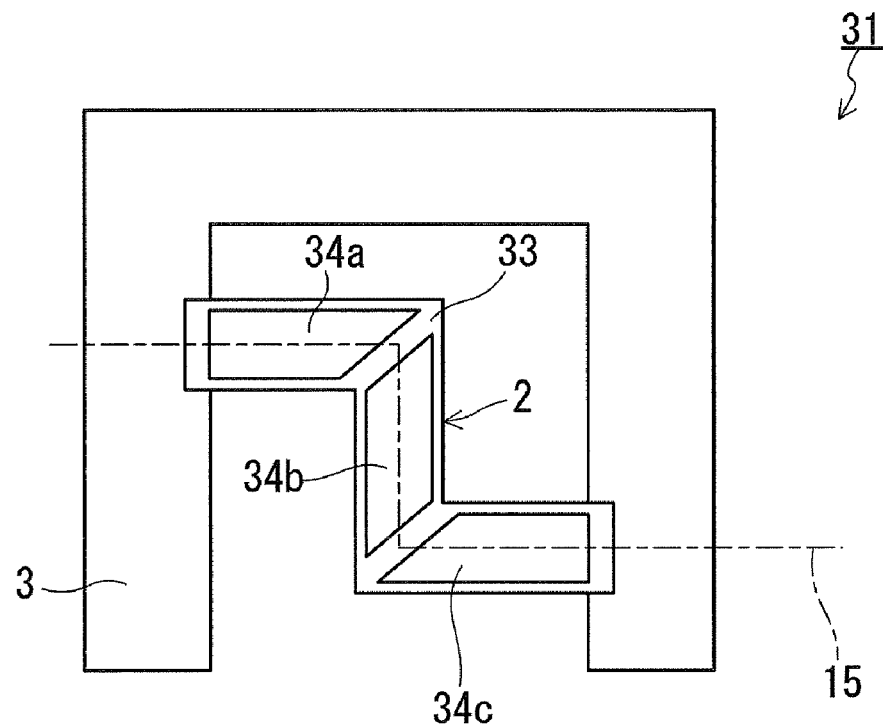
FIG. 5A is a plan view schematically showing another example of the piezoelectric power generating element of the present invention.
Figure 5B:
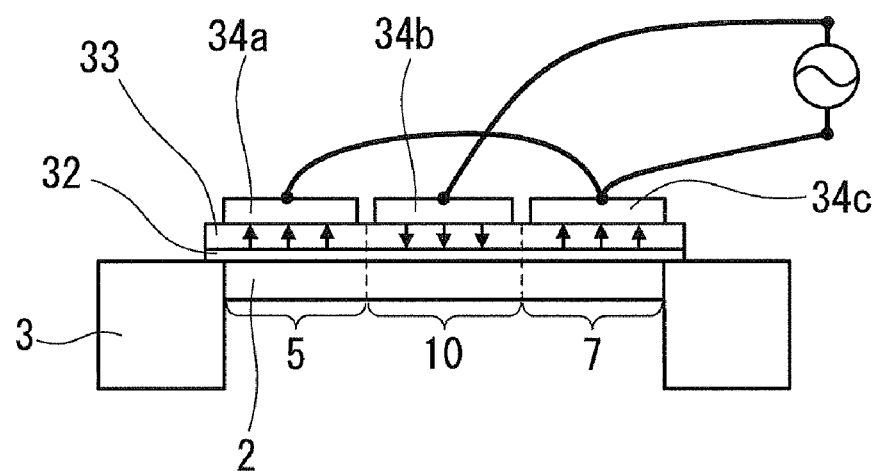
FIG. 5B is a cross-sectional view of the piezoelectric power generating element shown in FIG. 5A, as taken along the center line of the vibration beam comprised in the element.

FIG. 5A and FIG. 5B show another example of the piezoelectric power generating element of the present invention. FIG. 5B shows a cross section of a piezoelectric power generating element 31 shown in FIG. 5A, as taken along the center line 15 of a vibration beam 2 comprised in the element 31. The piezoelectric power generating element 31 shown in FIG. 5A and FIG. 5B is the same as the piezoelectric power generating element 1 shown in FIG. 1 and FIG. 2, except that one electrode (an upper electrode 34) selected from a pair of electrodes (the upper electrode 34 and a lower electrode 32) that sandwich the piezoelectric layer 33 therebetween is divided into two or more (upper electrodes 34a, 34b, and 34c) and provided along the vibration beam 2.

The upper electrode 34a is provided on the surface of the first portion 5 of the vibration beam 2 via the lower electrode 32 and the piezoelectric layer 33. The upper electrode 34b is provided on the surface of the third portion 10 of the vibration beam 2 via the lower electrode 32 and the piezoelectric layer 33. The upper electrode 34c is provided on the surface of the second portion 7 of the vibration beam 2 via the lower electrode 32 and the piezoelectric layer 33.

The entire vibration beam 2 is displaced in the same direction with respect to a z-direction external vibration. On the other hand, the in-plane stress generated on the surface of the vibration beam 2, that is, the stress to which the piezoelectric layer 33 provided on the surface of the vibration beam 2 is subjected, differs among the first portion 5, the second portion 7, and the third portion 10. More specifically, one end of the first portion 5 and one end of the second portion 7 are fixed to the support member 3 (these portions each have a fixed end). On the other hand, both ends of the third portion 10 can vibrate. Therefore, when the first portion 5 and the second portion 7 are subjected to compressive stress, the third portion 10 is subjected to tensile stress. When the first portion 5 and the second portion 7 are subjected to tensile stress, the third portion 10 is subjected to compressive stress. The vibration applies compressive stress and tensile stress periodically and alternately to the respective portions. Thus, the direction of electric fields generated in the portions of the piezoelectric layer corresponding to the first portion 5 and the second portion 7 is opposite to that of an electric field generated in the portion thereof corresponding to the third portion 10 (see FIG. 5B. Arrows in the piezoelectric layer 33 indicate the directions of the electric fields generated therein at a given moment). Therefore, when the pair of undivided electrodes that sandwich the piezoelectric layer 33 therebetween are provided as common electrodes for all the first portion 5, the second portion 7, and the third portion 10, electric power generated in the portions of the piezoelectric layer corresponding to the first portion 5 and the second portion 7 and electric power generated in the portion thereof corresponding to the third portion 10 are cancelled each other out. This decreases the amount of electric power generated in the piezoelectric power generating element.

In contrast, in the element 31 shown in FIG. 5A and FIG. 5B, the upper electrode 34 is divided into three. This can reduce the degree of cancellation of electric powers generated in the piezoelectric layer 33. Therefore, it is preferable in the piezoelectric power generating element of the present invention that at least one electrode selected from the pair of electrodes that sandwich the piezoelectric layer therebetween be divided in two or more and provided along the vibration beam. The manner in which at least one electrode is divided is not particularly limited to a specific manner. The cancellation of electric powers generated in the piezoelectric layer can be almost prevented depending on the division of the electrode and the wiring for extracting electric power generated therein. In the example shown in FIG. 5A and FIG. 5B, the upper electrode 34 is divided into three electrodes 34a, 34c, and 34b corresponding to the first portion 5, the second portion 7, and the third portion 10, respectively. In this case, as shown in FIG. 5B, the portion corresponding to the first portion 5 and the portion corresponding to the second portion 7 in the piezoelectric layer are electrically connected in parallel through the lower electrode 32. In addition to this, the portions corresponding to the first portion 5 and the second portion 7, and the portion corresponding to the third portion 10 in the piezoelectric layer are electrically connected in series through the lower electrode 32. With this configuration, the cancellation of electric powers generated is almost prevented, and a larger amount of electric power can be extracted.

As described above, a larger amount of electric power is generated in the vicinity of the fixed ends of the vibration beam. Therefore, the electrode 34b provided on the surface of the third portion may be omitted.

The wiring may be formed in the following manner: the electrode 34a and the lower electrode 32 are used to extract electric power generated in the portion of the piezoelectric layer corresponding to the first portion 5; the electrode 34c and the lower electrode 32 are used to extract electric power generated in the portion of the piezoelectric layer corresponding to the second portion 7; and the electrode 34b and the lower electrode 32 are used to extract electric power generated in the portion of the piezoelectric layer corresponding to the third portion 10. That is, electric power generated in the portion corresponding to the first portion 5, electric power generated in the portion corresponding to the second portion 7, and electric power generated in the portion corresponding to the third portion 10 are extracted separately.

Figure 6A:
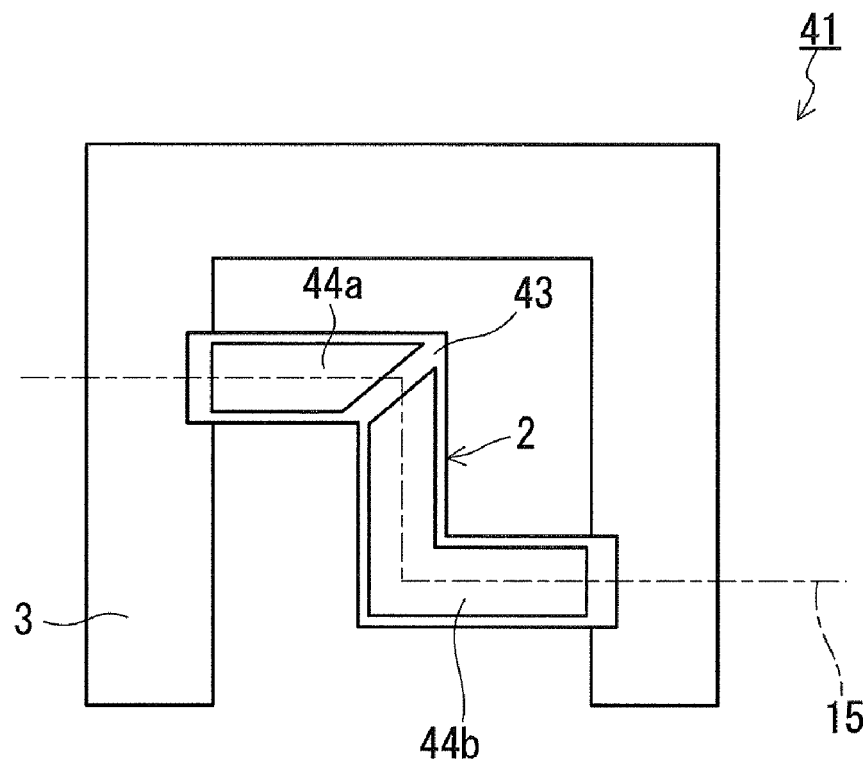
FIG. 6A is a plan view schematically showing still another example of the piezoelectric power generating element of the present invention.
Figure 6B:
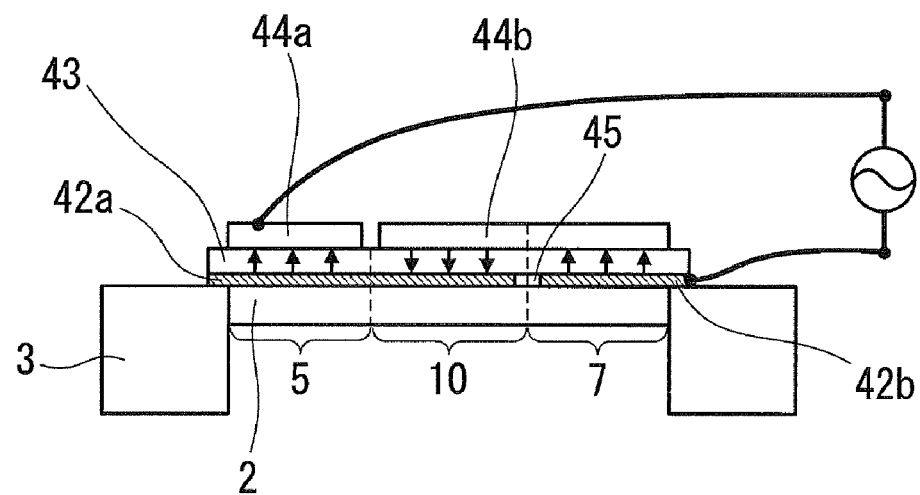
FIG. 6B is a cross-sectional view of the piezoelectric power generating element shown in FIG. 6A, as taken along the center line of the vibration beam comprised in the element.

FIG. 6A and FIG. 6B show another example in which at least one electrode is divided into two or more and provided along the vibration beam. FIG. 6B shows a cross section of a piezoelectric power generating element 41 shown in FIG. 6A, as taken along the center line 15 of the vibration beam 2 comprised in the element 41. The piezoelectric power generating element 41 shown in FIG. 6A and FIG. 6B is the same as the piezoelectric power generating element 1 shown in FIG. 1 and FIG. 2, except that each of a pair of electrodes (a lower electrode 42 and an upper electrode 44) that sandwich a piezoelectric layer 43 therebetween is divided into two or more (lower electrodes 42a and 42b, and upper electrodes 44a and 44b) and provided along the vibration beam 2.

The upper electrode 44a is provided on the surface of the first portion 5 of the vibration beam 2 via the lower electrode 42a and the piezoelectric layer 43. The upper electrode 44b is provided on the surface of the second portion 7 of the vibration beam 2 via the lower electrode 42a and the piezoelectric layer 43, and on the surface of the third portion 10 of the vibration beam 2 via the lower electrode 42b and the piezoelectric layer 43. The lower electrode 42a is provided on the surface of the first portion 5 and on the surface of the second portion 7 of the vibration beam 2. The lower electrode 42b is provided on the surface of the third portion 10 of the vibration beam 2. An insulating gap 45 is formed between the lower electrode 42a and the lower electrode 42b to electrically insulate these electrodes 42a and 42b. The insulating gap 45 may be a cavity or may be made of an insulating material. In the element 41 shown in FIG. 6A and FIG. 6B, the portion corresponding to the first portion 5, the portion corresponding to the second portion 7, and the portion corresponding to the third portion 10 in the piezoelectric layer are electrically connected in series. In the element 41, the above-described cancellation of powers is almost prevented, and a larger amount of electric power can be extracted.

In addition to this, in the element 41, the electrodes for extracting electric power are provided in the vicinity of the fixed ends of the vibration beam 2. Therefore, it is easy to connect the element 41 with an external circuit.

As shown in FIG. 1, the vibration beam comprised in the piezoelectric power generating element of the present invention may have a bent portion. The vibration beam 2 comprised in the element 1 shown in FIG. 1 has two right-angled bent portions. In the case where the vibration beam has a bent portion in the piezoelectric power generating element of the present invention, the bending angle of the bent portion is an obtuse angle or an acute angle.

Figure 7A:
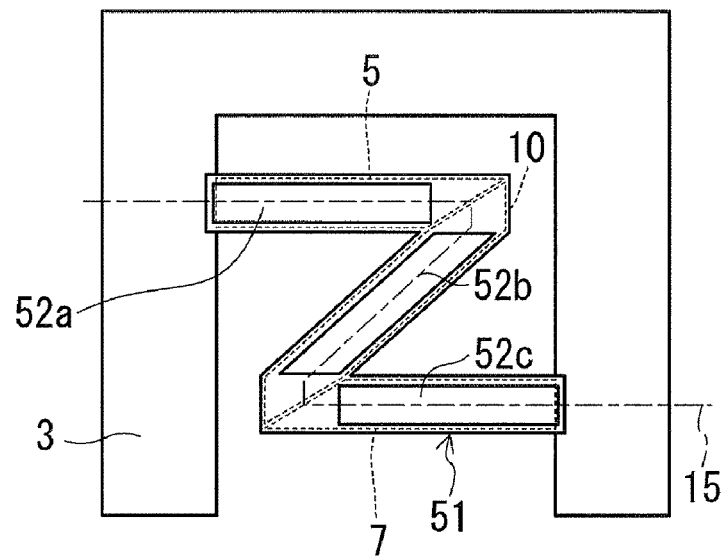
FIG. 7A is a plan view schematically showing yet still another example of the piezoelectric power generating element of the present invention.

FIG. 7A shows an example in which the bending angle of the bent portion of the vibration beam is an acute angle. A vibration beam 51 comprised in an element shown in FIG. 7A has two acute-angled bent portions. The acute-angled bent portions can increase the utilization efficiency of the space surrounded by the support member 3 and for accommodating the vibration beam 51. As a result, the amount of electric power generated per unit area of the element can be increased.

Figure 7B:
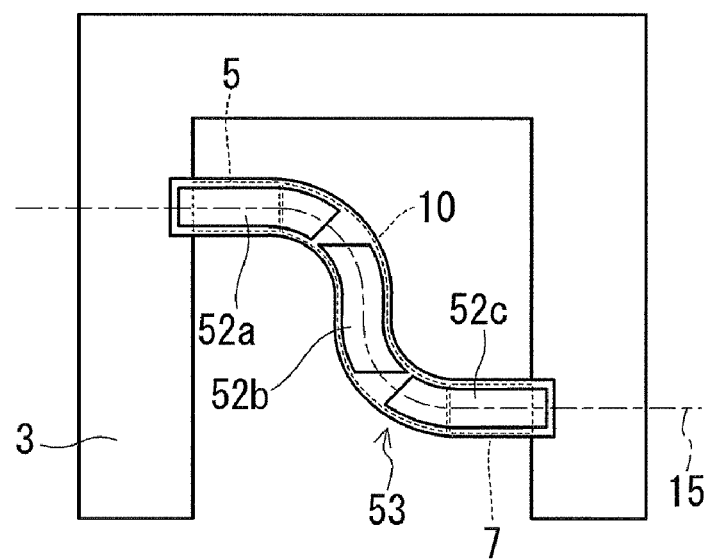
FIG. 7B is a plan view schematically showing yet still another example of the piezoelectric power generating element of the present invention.
Figure 7C:
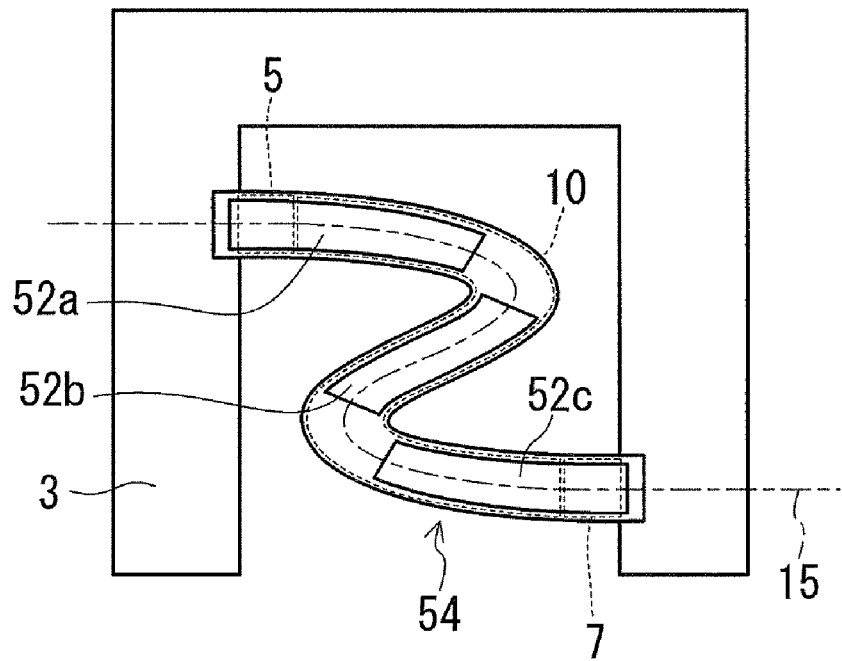
FIG. 7C is a plan view schematically showing yet still another example of the piezoelectric power generating element of the present invention.

FIG. 7B shows an example in which the bending angle of the bent portion of the vibration beam is an obtuse angle. A vibration beam comprised in an element shown in FIG. 7B has two obtuse-angled bent portions. FIG. 7C shows an example in which a vibration beam has two acutely rounded bent portions. In a vibration beam with an angled portion, a crack may occur at the angled portion by repeated application of vibration. In the examples shown in FIG. 7B and FIG. 7C, the occurrence of such a crack can be suppressed. As a result, damage occurs in the element less frequently, and a more robust element can be obtained.

In each of the examples shown in FIG. 7A to FIG. 7C, the upper electrode is divided into two or more (upper electrodes 52a, 52b, and 52c) and provided along the vibration beam. The first portion 5 and the second portion 7 in each of the examples of FIG. 7A to FIG. 7C are the portions in which the center lines 15 are straight lines. The rest of the vibration beam 51, 53 or 54 is the third portion 10.

Figure 8A:
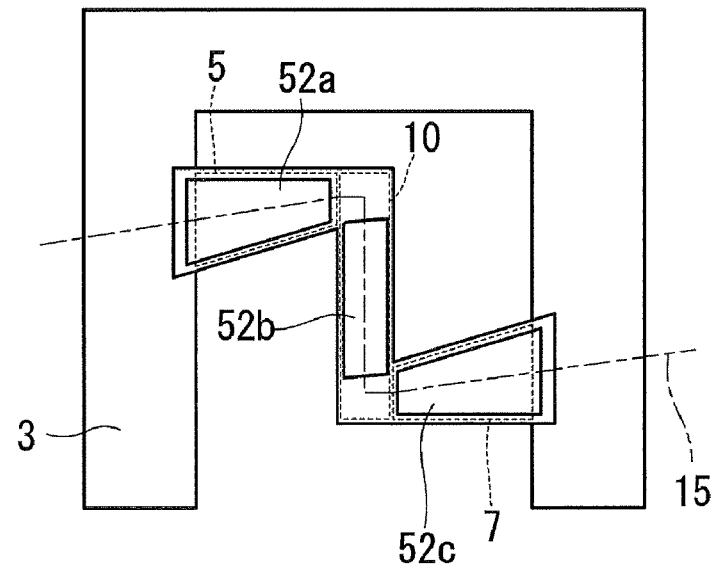
FIG. 8A is a plan view schematically showing yet still another example of the piezoelectric power generating element of the present invention.
Figure 8B:
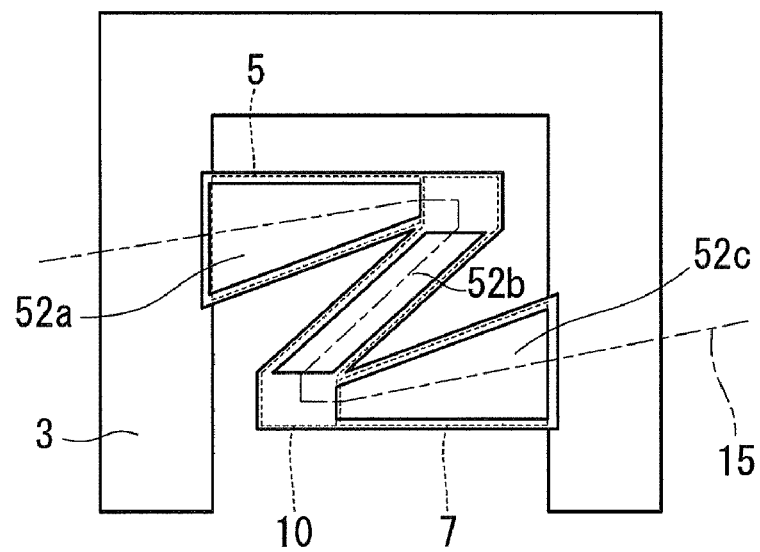
FIG. 8B is a plan view schematically showing yet still another example of the piezoelectric power generating element of the present invention.
Figure 8C:
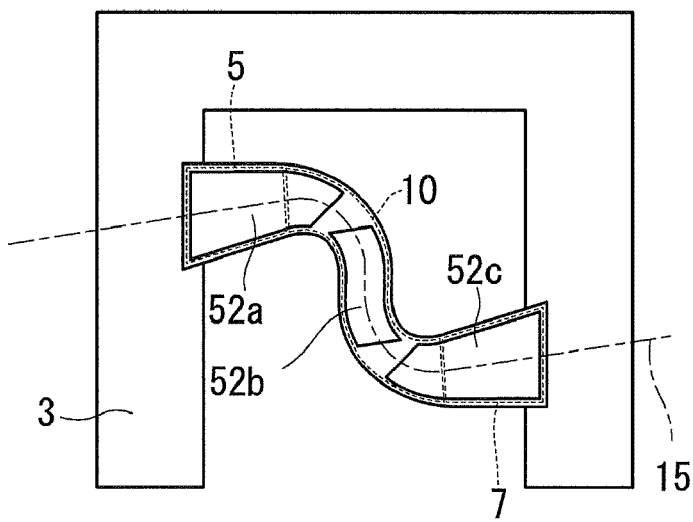
FIG. 8C is a plan view schematically showing yet still another example of the piezoelectric power generating element of the present invention.
Figure 8D:
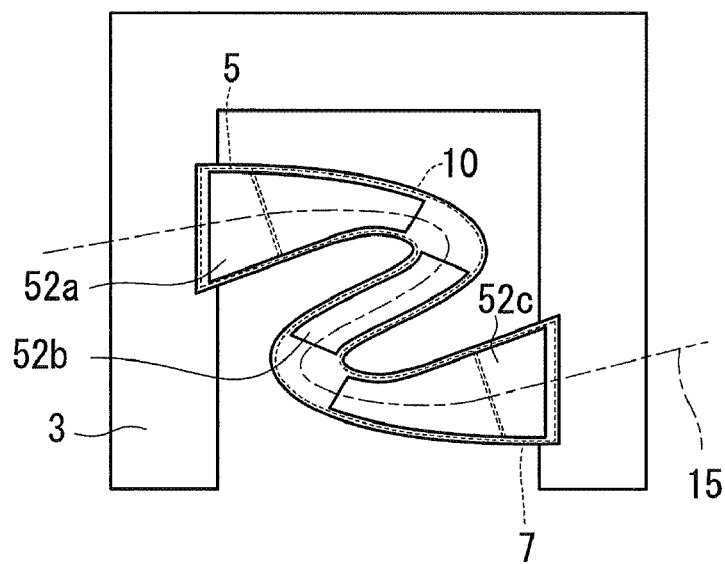
FIG. 8D is a plan view schematically showing yet still another example of the piezoelectric power generating element of the present invention.

FIG. 8A shows another example of the element shown in FIG. 5A, in which the vibration beam has an increased width near its fixed ends. FIG. 8B shows another example of the element shown in FIG. 7A, in which the vibration beam has an increased width near its fixed ends. FIG. 8C shows another example of the element shown in FIG. 7B, in which the vibration beam has an increased width near its fixed ends. FIG. 8D shows another example of the element shown in FIG. 7C, in which the vibration beam has an increased width near its fixed ends. The use of a vibration beam having an increased width near its fixed ends, as shown in these examples, improves the power generation efficiency of the resulting piezoelectric power generating element. In addition to this, the utilization efficiency of the space surrounded by the support member 3 and for accommodating the vibration beam can be increased. As a result, the amount of electric power generated per unit area of the element can be increased. Preferably, the vibration beam has a shape such that the width thereof increases toward the fixed ends.

The piezoelectric power generating element of the present invention can comprise arbitrary components other than the above-described components as long as the effects of the present invention can be obtained.

[Method of Generating Electric Power Using Piezoelectric Power Generating Element]

When vibration is applied to the above-described piezoelectric power generating element of the present invention, a potential difference is generated between the pair of electrodes that sandwich the piezoelectric layer therebetween, and thus, electric power is obtained via the electrodes. The above-described preferred embodiment of the piezoelectric power generating element also applies to a piezoelectric power generating element used in the electric power generation method of the present invention.

When external mechanical vibration is applied to the piezoelectric power generating element, the vibration beam comprised in the element vibrates. This vibration generates an electromotive force based on the piezoelectric effect across the piezoelectric layer. As a result, a potential difference is generated between the pair of electrodes (the upper electrode and the lower electrode) that sandwich the piezoelectric layer therebetween.

According to the electric power generation method of the present invention, a larger amount of electric power is achieved.

EXAMPLES

Hereinafter, the present invention is described in more detail by way of examples. The present invention is not limited to the following examples.

Example 1

In Example 1, a silicon (Si) substrate was micromachined to form a support member and a vibration beam fixed to the support member. Two types of vibration beams were formed. One was a straight bridge-type vibration beam shown in FIG. 12. The other one was a crank-shaped vibration beam shown in FIG. 1. On the surface of each of the vibration beams thus formed, a piezoelectric layer composed of a perovskite-type ferroelectric Pb(Zr,Ti)$O_3$ (hereinafter PZT) and a pair of electrodes (an upper electrode and a lower electrode) that sandwich the piezoelectric layer therebetween were provided. Thus, a piezoelectric power generating element of the present invention (in which a vibration beam has the shape shown in FIG. 1) and a piezoelectric power generating element for comparison (in which a vibration beam has the shape shown in FIG. 12) were formed.

A specific method for forming these piezoelectric power generating elements is described below.

First, a 100 nm-thick iridium (Ir) layer, which was to serve as a lower electrode after dry etching, was formed on a Si substrate by sputtering. Next, a 3.6 μm-thick PZT thin film, which was to serve as a piezoelectric layer after dry etching, was formed on the Ir layer by sputtering. The PZT thin film was formed under the condition of the substrate temperature of 600° C. Next, a layered structure of Si substrate/Ir layer/PZT thin film was patterned into the shape shown in FIG. 1 by photolithography. Aside from this, another layered structure of Si substrate/Ir layer/PZT thin film was patterned into the shape shown in FIG. 12 by photolithography.

Each of the layered structures was patterned so that the vibration beam was formed to have a uniform width (a width as viewed in the direction perpendicular to the plane in which the vibration beam extended) of 2 mm throughout its length. Each of the support members had the shape (U-shape) shown in FIG. 1 and FIG. 12. The distance between the parallel sides of the U-shaped support member was 10 mm. In the shape shown in FIG. 1, the length of the third portion 10 of the vibration beam 2 was 4 mm in terms of the length of the center line 15 thereof.

Next, a 100 nm-thick gold (Au) layer, which was to serve as an upper electrode after dry etching, was formed on the PZT thin film by sputtering. A titanium (Ti) layer serving as an adhesive layer was provided between the PZT thin film and the Au layer. The Au layer was formed in contact with the portions serving as the fixed ends of the vibration beam. Next, the entire structure was dry-etched so that the vibration beam had a thickness of 80 μm. Thus, the piezoelectric power generating element having the shape shown in FIG. 1 and the piezoelectric power generating element having the shape shown in FIG. 12 were formed respectively.

Each of the two types of piezoelectric power generating elements thus formed was set in a vibration tester. Next, vibration was applied to the element in the direction (z direction) perpendicular to the main surface of the vibration beam thereof by the vibration tester. During the application of vibration, the upper electrode and the lower electrode on one of the fixed ends of the vibration beam are connected to a load resistance so as to estimate the amount of electric power generated in the element.

Figure 9:
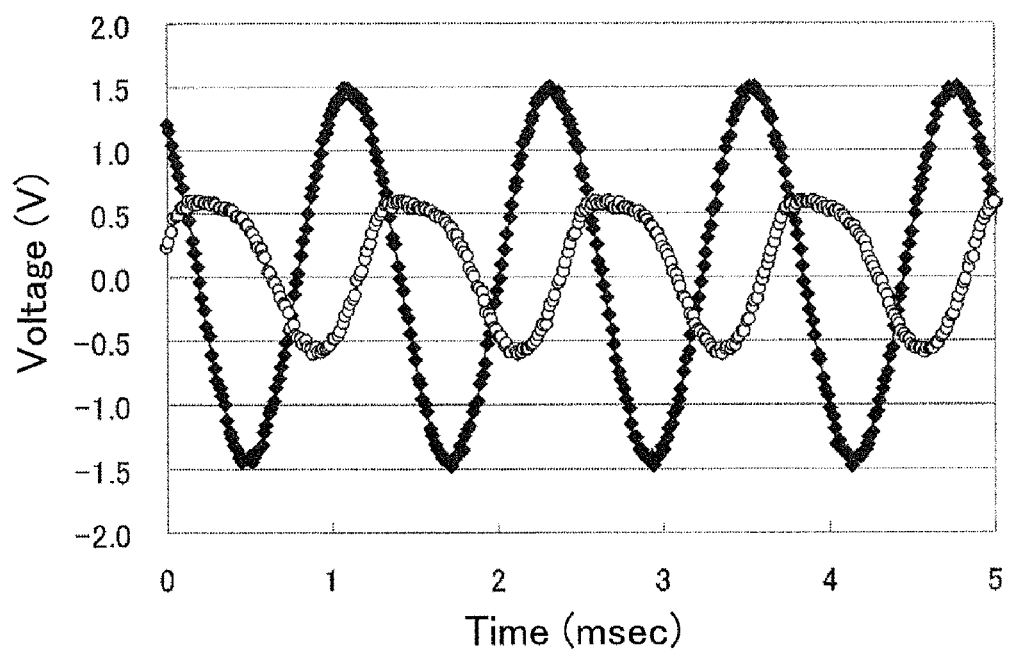
FIG. 9 is a graph showing the time dependence of voltages generated by piezoelectric power generating elements evaluated in Example 1.

FIG. 9 shows the time dependence of voltage (a potential difference generated between the upper electrode and the lower electrode) generated at no load in each of the elements when an external vibration with a maximum acceleration of 2G (G is a gravitational acceleration) and a frequency of 800 Hz was applied to the element. A line of white dots corresponds to the potential difference outputted from the piezoelectric power generating element having the shape shown in FIG. 12. A line of black dots corresponds to the potential difference outputted from the piezoelectric power generating element having the shape shown in FIG. 1. As shown in FIG. 9, the peak-to-peak voltage outputted from the element having the shape shown in FIG. 1 was 2.8 V. This peak-to-peak voltage was twice or more than that outputted from the element having the shape shown in FIG. 12.

Next, each of the elements was connected to a load so as to estimate the average amount of electric power generated therein. Each of the elements generated a maximum amount of electric power, when it was connected to a load resistance of 5 kΩ. The maximum amount of electric power generated in the element having the shape shown in FIG. 12 was 8 μW in terms of effective value. In contrast, the maximum amount of electric power generated in the element having the shape shown in FIG. 1 was 50 μW in terms of effective value.

Next, an external vibration with an increased maximum acceleration was applied to each of the elements. The maximum amount of electric power generated in the element having the shape shown in FIG. 12 was saturated at 10 μW. Presumably, this is because the limit of the amplitude of the vibration beam was low. In contrast, the maximum amount of electric power generated in the element having the shape shown in FIG. 1 increased as the acceleration increased. It was confirmed that the instantaneous maximum amount of electric power generated in the element having the shape shown in FIG. 1 reached 400 μW, when an external vibration with a maximum acceleration of 2G was applied. In addition to this, when an external vibration with a maximum acceleration of 10 G was applied, the element continued to generate electric power without being damaged.

Example 2

A piezoelectric power generating element having the shape shown in FIG. 1 and a piezoelectric power generating element having the shape shown in FIG. 3 were formed using the same materials and techniques as in Example 1. In each of the elements, the vibration beam had a uniform width of 2 mm throughout its length. Each of the support members had the shape (U-shape) shown in FIG. 1 and FIG. 3. The distance between the parallel sides of the U-shaped support member was 10 mm. In the shape shown in FIG. 1, the length of the third portion 10 of the vibration beam 2 was 4 mm in terms of the length of the center line 15 thereof. In each of the elements, the upper electrode was formed to extend about 3 mm from the fixed ends of the vibration beam. A weight was placed at the center point 16 of the vibration beam in the element having the shape shown in FIG. 1 and a weight was placed at the center point 320 of the vibration beam in the element having the shape shown in FIG. 3, respectively, so that the resonance frequency of each of the vibration beams was adjusted to about 800 Hz.

Each of the two types of piezoelectric power generating elements thus formed was set in a vibration tester.

Next, an external vibration with a maximum acceleration of 3G was applied to the element in the direction (z direction) perpendicular to the main surface of the vibration beam thereof by the vibration tester. During the application of vibration, the maximum amount of electric power generated in each of the elements was estimated in the same manner as in Example 1. Both of the elements achieved an amount of electric power of 100 μW in terms of effective value.

Next, an external vibration not in the z direction but inclined at 45 degrees with respect to the y direction, that is, an external vibration including both a z-direction component and a y-direction component, was applied to each of the elements. The maximum amount of electric power generated in the element having the shape shown in FIG. 3 was 70 μW in terms of effective value. In contrast, the maximum amount of electric power generated in the element having the shape shown in FIG. 1 was 100 μW in terms of effective value. In the element having the shape shown in FIG. 1, the y-direction vibration was concentrated into the z-direction vibration. This means that the piezoelectric power generating element having the shape shown in FIG. 1 was configured so that not only the z-direction vibration but also the y-direction vibration contributed to electric power generation to achieve very high efficiency in electric power generation.

Example 3

Figure 10:
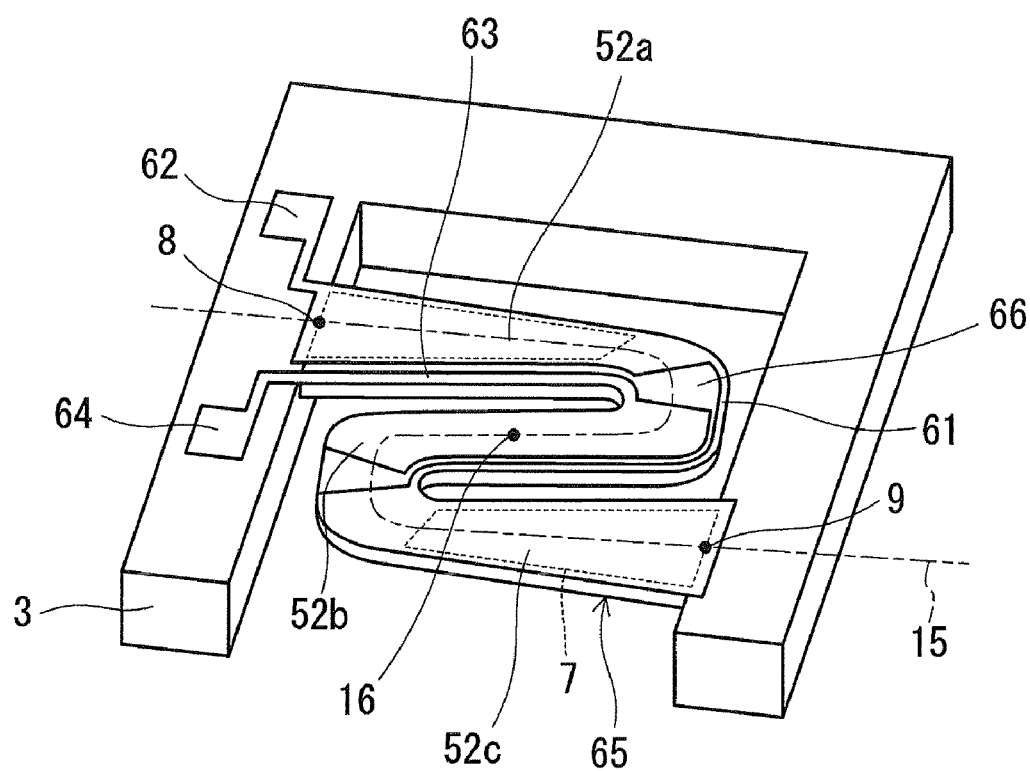
FIG. 10 is a perspective view schematically showing the configuration of a piezoelectric power generating element evaluated in Example 3.
Figure 11:
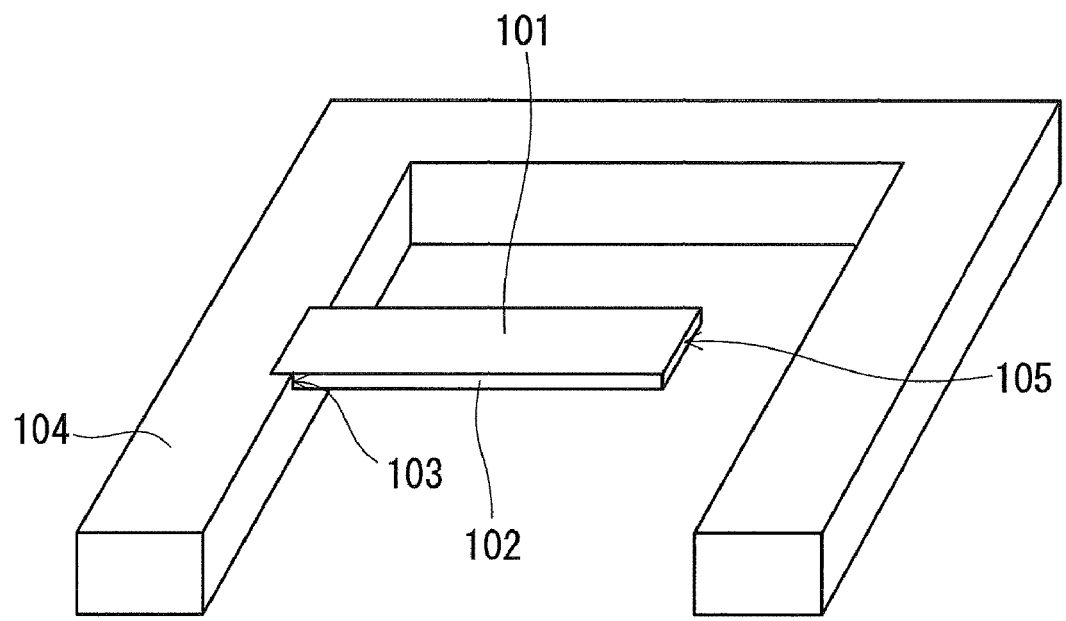
FIG. 11 is a perspective view schematically showing an example of a conventional piezoelectric power generating element comprising a cantilever-type vibration beam.

A piezoelectric power generating element having the shape shown in FIG. 10 was formed using the same materials and techniques as in Example 1. The support member 3 had a U-shape. The distance between the parallel sides of the U-shaped support member was 10 mm. The vibration beam 65 had a uniform width of 2 mm at the third portion (i.e., the portion other than the first portion 5 and the second portion 7) thereof. The vibration beam 65 had a width of 4 mm at the fixed end of the first portion 5 and the fixed end of the second portion 7. The vibration beam 65 had a width of 2 mm at the other end of the first portion 5 and the other end of the second portion 7, both connected to the third portion. That is, the width of the vibration beam 65 increased toward the fixed ends thereof. A weight was placed at the center point 16 of the vibration beam 65 (i.e., the center point of the center line 15 of the vibration beam 65 connecting one fixed end and the other fixed end thereof) so that the resonance frequency of the vibration beam was adjusted to about 800 Hz. For simplicity of the drawing, the third portion is not shown.

In this element, an upper electrode 52a formed on the first portion 5 and an upper electrode 52c formed on the second portion 7 are electrically connected by a lead-out wiring 61 provided along the side of an upper electrode 52b on the third portion. The upper electrode 52a is led out to an electrode terminal 62 formed on the support member 3. The upper electrode 52b formed on the third portion is led out by a lead-out wiring 63 provided along the side of the upper electrode 52a, and electrically connected to an electrode terminal 64. In this configuration, the portions of a piezoelectric layer 66 provided on the first portion 5, the second portion 7, and the third portion are connected in series between the electrode terminals 62 and 64, and thereby electric powers generated in these portions of the piezoelectric layer 66 are connected in series between the electrode terminals 62 and 64. This means that the electrical connection shown in FIG. 5B is achieved in this element. With this configuration, efficient electric power generation was expected to be ensured.

The piezoelectric power generating element thus formed was set in a vibration tester.

Next, an external vibration with a maximum acceleration of 2G was applied to the element in the direction (z direction) perpendicular to the main surface of the vibration beam thereof by the vibration tester. The maximum amount of electric power generated in this element during the application of vibration was estimated in the same manner as in Example 1. In this element, the maximum electric power (i.e., 1.5 mW in terms of effective value) was obtained, when it was connected to a load resistance of 2 kΩ. In addition to this, the instantaneous maximum amount of electric power generated in the element reached 10 mW. This element has a vibration beam having a shape with less empty space surrounded by the support member. Because of this shape, a large amount of electric power of 2 mW/cm$^2$ in terms of effective value was obtained per unit area (i.e., per unit area of the element as viewed in the direction perpendicular to the plane in which the vibration beam extended).

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

INDUSTRIAL APPLICABILITY

The piezoelectric power generating element of the present invention is useful as a small, self-contained electric power generating element that derives electric power from the surrounding environment. The piezoelectric power generating element of the present invention constitutes a battery-free device. Examples of such devices include electronic devices such as various types of sensors and wireless devices.

What is claimed is:

1. A piezoelectric power generating element comprising: a support member; a strip-shaped vibration beam; a piezoelectric layer; and a pair of electrodes that sandwich the piezoelectric layer therebetween, wherein
    first and second ends of the vibration beam are fixed to the support member,
    the piezoelectric layer and the pair of electrodes are provided on a surface of the vibration beam,
    the vibration beam extends in a plane when the vibration beam is not vibrating,
    the vibration beam has a first portion that extends from the first end fixed to the support member, a second portion that extends from the second end fixed to the support member, and a third portion that connects an end of the first portion opposite to the first end and an end of the second portion opposite to the second end, and
    the vibration beam has a shape such that, when viewed in a direction perpendicular to the plane,
        a first direction in which the first portion extends from the first end is a direction closer to the second end, and a second direction in which the second portion extends from the second end is a direction closer to the first end,
        the first and second directions each make an angle of more than 0° and less than 90° with respect to a straight line connecting a center of the first end with a center of the second end, and
        the third portion intersects once the straight line.

2. The piezoelectric power generating element according to claim 1, wherein the first direction and the second direction are parallel to each other.

3. The piezoelectric power generating element according to claim 1, wherein the vibration beam has a point-symmetric shape, when viewed in the direction perpendicular to the plane.

4. The piezoelectric power generating element according to claim 1, wherein at least one electrode selected from the pair of electrodes is divided into two or more and provided along the vibration beam.

5. A method of generating electric power using a piezoelectric power generating element, the method comprising:
    (a) preparing the piezoelectric power generating element, wherein
    the piezoelectric power generating element comprises a support member, a strip-shaped vibration beam, a piezoelectric layer, and a pair of electrodes that sandwich the piezoelectric layer therebetween,
    first and second ends of the vibration beam are fixed to the support member,
    the piezoelectric layer and the pair of electrodes are provided on a surface of the vibration beam,
    the vibration beam extends in a plane when the vibration beam is not vibrating,
    the vibration beam has a first portion that extends from the first end fixed to the support member, a second portion that extends from the second end fixed to the support member, and a third portion that connects an end of the first portion opposite to the first end and an end of the second portion opposite to the second end, and
    the vibration beam has a shape such that, when viewed in a direction perpendicular to the plane,
        a first direction in which the first portion extends from the first end is a direction closer to the second end, and a second direction in which the second portion extends from the second end is a direction closer to the first end, the first and second directions each make an angle of more than 0° and less than 90° with respect to a straight line connecting a center of the first end and a center of the second end, and the third portion intersects once the straight line; and (b) applying vibration to the piezoelectric power generating element so as to generate a potential difference between the pair of electrodes.

6. The method according to claim 5, wherein the first direction and the second direction are parallel to each other.

7. The method according to claim 5, wherein the vibration beam has a point-symmetric shape, when viewed in the direction perpendicular to the plane.

8. The method according to claim 5, wherein at least one electrode selected from the pair of electrodes is divided into two or more and provided along the vibration beam.

* * * * *